United States Patent
Gutta et al.

(10) Patent No.: US 9,124,282 B1
(45) Date of Patent: Sep. 1, 2015

(54) DIGITAL-TO-ANALOG CONVERTER WITH CORRECTION FOR PARASITIC ROUTING RESISTANCE

(71) Applicants: Avinash Gutta, Bangalore (IN); Sharad Vijaykumar, Bangalore (IN)

(72) Inventors: Avinash Gutta, Bangalore (IN); Sharad Vijaykumar, Bangalore (IN)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/202,906

(22) Filed: Mar. 10, 2014

(51) Int. Cl.
H03M 1/66 (2006.01)
H03M 1/06 (2006.01)

(52) U.S. Cl.
CPC ............. *H03M 1/0617* (2013.01); *H03M 1/66* (2013.01)

(58) Field of Classification Search
CPC ... H03M 1/66; H03M 1/0617; H03M 1/0678; H03M 1/747
USPC ........... 341/118–144; 370/286, 479; 375/219, 375/258, 259
See application file for complete search history.

(56) References Cited

U.S. PATENT DOCUMENTS

| | | | | |
|---|---|---|---|---|
| 5,812,017 | A * | 9/1998 | Golla et al. | 327/536 |
| 6,693,480 | B1 * | 2/2004 | Wong | 327/390 |
| 7,026,971 | B2 * | 4/2006 | Horsky et al. | 341/145 |
| 7,095,348 | B1 * | 8/2006 | Sutardja et al. | 341/144 |
| 7,113,121 | B1 * | 9/2006 | Sutardja et al. | 341/144 |
| 7,184,253 | B1 * | 2/2007 | Hartranft et al. | 361/111 |
| 7,194,037 | B1 * | 3/2007 | Sutardja | 375/258 |
| 7,564,385 | B2 | 7/2009 | Soude et al. | |
| 8,264,268 | B2 * | 9/2012 | Cho et al. | 327/307 |
| 8,441,381 | B2 * | 5/2013 | Bajdechi et al. | 341/135 |
| 8,536,899 | B1 * | 9/2013 | Lu et al. | 327/51 |
| 8,558,591 | B1 * | 10/2013 | Sanchez et al. | 327/156 |
| 8,896,472 | B2 * | 11/2014 | Seo et al. | 341/145 |
| 9,007,246 | B2 * | 4/2015 | Bajdechi et al. | 341/135 |

\* cited by examiner

*Primary Examiner* — Lam T Mai
(74) *Attorney, Agent, or Firm* — Kenyon & Kenyon LLP (57) ABSTRACT

An embodiment of a digital-to-analog converter circuit includes a resistor network connected to an output node, a switch network having a first plurality of switches connecting the resistor network to a first circuit node and a second plurality of switches connecting the resistor network to a second circuit node, a voltage reference to supply a reference voltage to the first circuit node, and a current generator connected to the first circuit node and the second circuit node, to generate a compensation current, draw the compensation current from the first circuit node, and supply the compensation current to the second circuit node. The current generator can generate the compensation current as a function of a current or a voltage of a component of the voltage reference or as a function of an analog output voltage produced at the output node.

26 Claims, 5 Drawing Sheets

DIGITAL-TO-ANALOG CONVERTER WITH CORRECTION FOR PARASITIC ROUTING RESISTANCE

BACKGROUND INFORMATION

Many types of digital-to-analog converter (DAC) circuits include a resistor network having individual resistors connected by a switch network to either a reference voltage or ground as a function of individual bits of a digital input. An analog output voltage produced on a node of the resistor network typically represents a conversion of the digital input to the analog domain.

Certain problems arise with the use of such resistor and switch networks in DAC circuits, however. Connections of the resistor network by the switch network to the reference voltage or ground depend on the value of the digital input at any given time, and therefore conductor lines supplying the reference voltage and ground experience a variable current draw. Additionally, the resistor and switch networks typically include a relatively large number of resistors and switches connected to these conductor lines, with these connections distributed over a physical dimension of the conductor line, resulting in parasitic resistances existing in the conductor line between the connections. The variable current draw then combines with the distributed parasitic resistances of the conductor lines to produce voltage levels delivered to the individual switches and resistors of the switch and resistor networks that vary from intended reference voltage or ground voltage values as a function of the digital input, which degrades the linearity of the DAC circuit.

Therefore, a need exists for DAC circuits having switch and resistor networks connected to one or more reference or ground voltages as a function of a digital input, but which show improved linearity in the presence of distributed parasitic resistances of conductor lines supplying these reference or ground voltages.

BRIEF DESCRIPTION OF THE DRAWINGS

So that features of the present invention can be understood, a number of drawings are described below. However, the appended drawings illustrate only particular embodiments of the invention and are therefore not to be considered limiting of its scope, for the invention may encompass other equally effective embodiments.

DETAILED DESCRIPTION OF EXAMPLE EMBODIMENTS

An embodiment of a DAC circuit can include a resistor network connected to an output node, a switch network having a first plurality of switches connecting the resistor network to a first circuit node and a second plurality of switches connecting the resistor network to a second circuit node, a voltage reference to supply a reference voltage to the first circuit node, and a current generator connected to the first circuit node and the second circuit node, to generate a compensation current, draw the compensation current from the first circuit node, and supply the compensation current to the second circuit node.

The current generator can generate the compensation current to have a value substantially equal to a subtraction of a first DAC current, which the switch network draws from the first circuit node into the resistor network, from a constant value, to thereby maintain a constant current in at least a portion of the first and second circuit nodes in the presence of a varying digital input.

The current generator can generate the compensation current as a function of the at least one current or voltage of a component of the voltage reference. For example, the current generator can generate the compensation current as a function of at least one current or voltage of an output transistor of the voltage reference that supplies the reference voltage to the first circuit node. To this end, the current generator can include at least one transistor to replicate the current in the output transistor of the voltage reference, a current processing circuit to subtract a current having a value substantially equal to the replicated current from a constant to generate a value of the compensation current, and a transistor to draw the compensation current from the first circuit node and supply the compensation current to the second circuit node.

The current generator can alternatively generate the compensation current as a function of an analog output voltage produced at the output node of the DAC circuit and corresponding to a conversion of a digital input to the analog domain. To this end, the current generator can include a plurality of amplifier circuits to generate the compensation current as the function of the analog output voltage, including a first amplifier circuit arranged in a negative feedback configuration to generate a control voltage as a difference function based on the analog output voltage and the reference voltage, and a second amplifier circuit arranged in a negative feedback configuration to regulate a voltage across a resistor and a gate-to-source voltage of a transistor as functions of the control voltage generated by the first amplifier circuit, with the transistor drawing the compensation current from the first circuit node and the resistor supplying the compensation current to the second circuit node.

The first and second circuit nodes can include first and second areas of conductive material, respectively. The voltage reference can supply the reference voltage to the first conductor area at a first location and the current generator can draw the compensation current from the first conductor area at a second location, with the first plurality of switches connecting to the first conductor area at locations between the first and second locations. Similarly, the current generator can draw the compensation current from the second conductor area at a first location and a ground can be supplied to the second conductor area at a second location, with the second plurality of switches connecting to the second conductor area at locations between the first and second locations.

Figure 1:
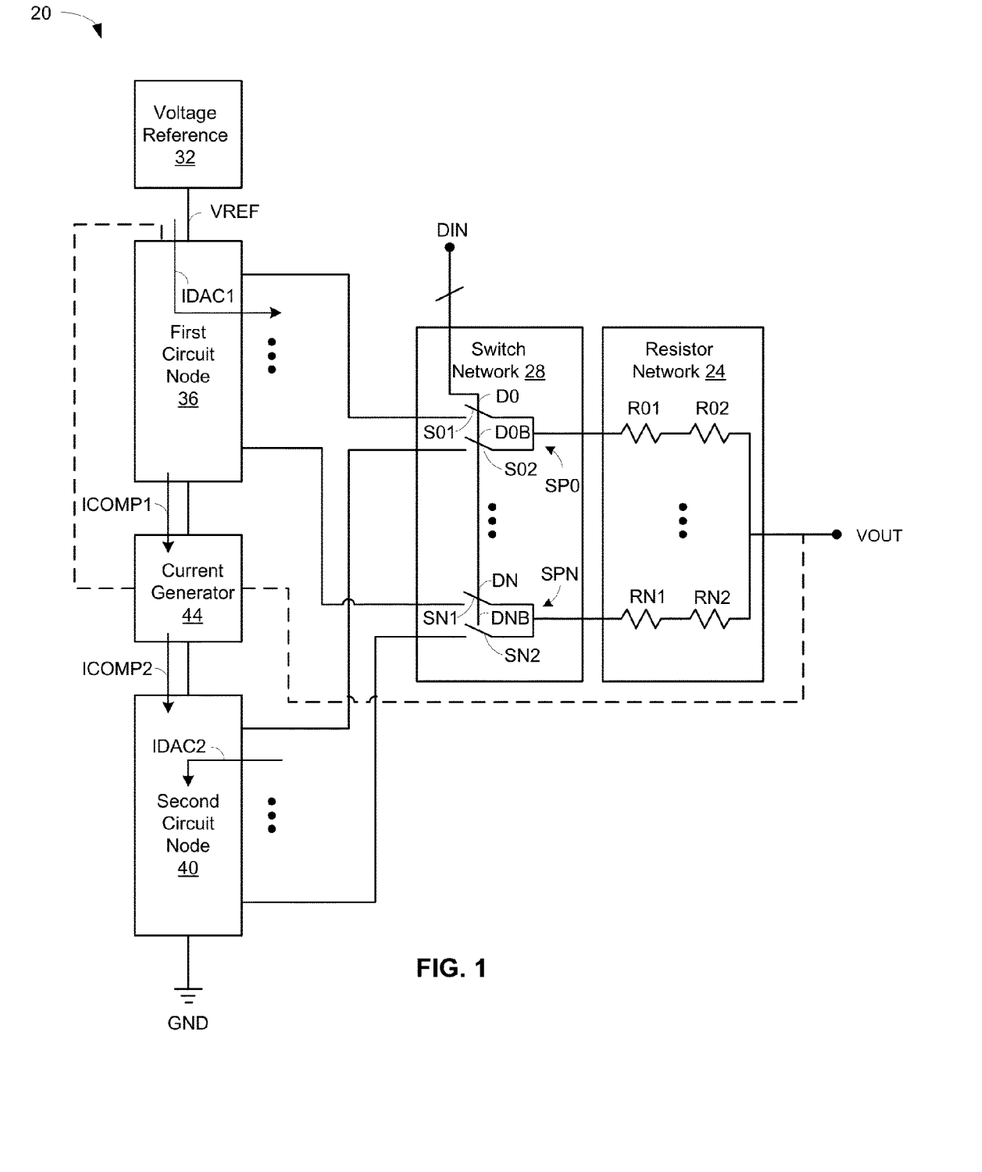
FIG. 1 is a circuit schematic depicting an embodiment of a DAC circuit including a current generator.

FIG. 1 depicts an embodiment of a DAC circuit 20 to produce an analog output VOUT corresponding to a received digital input DIN and having a correction implemented to improve linearity in the presence of distributed parasitic resistances of first and second conductive nodes 36, 40 supplying reference and ground voltages VREF, GND. The depicted DAC circuit 20 includes a resistor network 24, a switch network 28, a voltage reference 32, first and second circuit nodes 36, 40, and a current generator 44.

The resistor network 24 can include a plurality of branches, each branch including one or more resistors R01, R02 . . . RN1, RN2 and each branch connected to an output node VOUT at one and to a corresponding one of a plurality of switch pairs SP0 . . . SPN of the switch network 28 at another end. The switch network 28 can include a plurality of pairs of switches SP0 . . . SPN, each pair connected to a corresponding branch of the resistor network at a first pass-through terminal and including a corresponding one of a first plurality of the switches S01 . . . SN1 connected to the first circuit node 36 at a second pass-through terminal and a corresponding one of a second plurality of the switches S02 . . . SN2 connected to the second circuit node 40 at the second pass-through terminal. Each switch of each switch pair SP0 . . . SPN can receive at a control terminal, and be electrically enabled or disabled according to, a respective bit D0 . . . DN or inverse bit D0B . . . DNB of the digital input DIN.

The first circuit node 36 can include a first area of conductive material, such as a first rectilinear area of conductive material, connected to the first plurality of switches S01 . . . SN1 of the switch network 28 at a plurality of locations of the area and to a reference voltage VREF at another location of the area. The second circuit node 40 can include a second area of conductive material, such as a second rectilinear area of conductive material, connected to the second plurality of switches S02 . . . SN2 of the switch network 28 at a plurality of locations of the area and to ground GND, or optionally alternatively a second reference voltage, at another location of the area.

The voltage reference 32 can generate and supply the reference voltage VREF to the first circuit node 36. In embodiments, the voltage reference 32 can also optionally generate and supply the second reference voltage to the second circuit node 40.

In operation, individual bits D0 . . . DN and corresponding inverse bits D0B . . . DNB of the digital input DIN can be distributed to and control the operation of the switches of the switch network 28 to connect each branch of the resistor network 24 to either the reference voltage VREF or ground GND via the first or second circuit nodes 36, 40. Any given value of the digital input DIN can thus result in a corresponding unique configuration of resistor branch connections between the first circuit node 36, the output node VOUT, and the second circuit node 40, producing the analog output voltage VOUT at the output node corresponding to the digital input DIN.

For each value of the digital input DIN, a corresponding unique value or physical distribution of a first DAC current IDAC1 can be drawn from the voltage reference 32, through the first circuit node 36, and to those of the first plurality of switches S01 . . . SN1 connecting the first circuit node 36 to the resistor network 28 for that value of the digital input DIN. Similarly, for each value of the digital input DIN, a corresponding unique value or physical distribution of a second DAC current IDAC2 can be drawn to ground GND through the second circuit node 40 from those of the second plurality of switches S02 . . . SN2 connecting the second circuit node 40 to the resistor network 28 for that value of the digital input DIN.

The current generator 44 can generate and draw from the first circuit node 36 a first compensation current ICOMP1, and generate and supply to the second circuit node 40 a second compensation current ICOMP2, to at least partially compensate for the variability of the first and second DAC currents IDAC1, IDAC2 and any degradation of the linearity of the DAC circuit that may result.

In one embodiment, the first and second compensation currents ICOMP1, ICOMP2 can have values selected to be substantially equal to a value necessary to maintain constant first and second currents ICONST1, ICONST2 in at least a portion of the first and second circuit nodes 36, 40, respectively, in the presence of the variable first and second DAC currents IDAC1, IDAC2. That is, the first and second compensation currents ICOMP1, ICOMP2 can be selected to have values that satisfy the following equations:

$$ICOMP1 = ICONST1 - IDAC1; \text{ and} \qquad (1)$$

$$ICOMP2 = ICONST2 - IDAC2. \qquad (2)$$

Additionally, in one embodiment, the first and second compensation currents ICOMP1, ICOMP2 can have values selected to be substantially equal to each other, denoted as the compensation current ICOMP, and to a value necessary to maintain a constant current ICONST in at least a portion of the first or second circuit nodes 36, 40 in the presence of the first and second DAC currents IDAC1, IDAC2. That is, the compensation current ICOMP can be selected to have a value that satisfies at least one of the following equations:

$$ICOMP = ICONST - IDAC1; \text{ or} \qquad (3)$$

$$ICOMP = ICONST - IDAC2. \qquad (4)$$

Also, in one embodiment, the first and second DAC currents IDAC1, IDAC2 can be regarded as substantially equal to each other, and denoted as the conductor node current IDAC, and the compensation current ICOMP can be selected to have a value that satisfies the following equation:

$$ICOMP = ICONST - IDAC. \qquad (5)$$

Maintaining substantially constant currents in at least portions of the first and/or second circuit nodes 36, 40 can improve linearity in the DAC circuit 20 by at least partially eliminating deviations from the reference voltage VREF and ground GND at the connections of the first and second circuit nodes 36, 40 to the to the pass-through terminals of the first and second pluralities of switches S01 . . . SN1, S02 . . . SN2 of the switch network 28 that might otherwise result from the variable first and second DAC currents IDAC1, IDAC2, if left uncompensated, in view of the distributed parasitic resistances of the first and second circuit nodes 36, 40.

The current generator 40 can also optionally supply an additional current to the first circuit node 36 or receive the analog output voltage VOUT of the DAC circuit 20, such as in the embodiments of FIGS. 3 and 4, discussed below, which is shown in FIG. 1 using dashed-line connections between the current generator 40 and other components of the DAC circuit 20.

The first and second areas of a conductive material of the first and second circuit nodes can have one or more physical dimensions in a plane, with the first and second pluralities of switches S01 . . . SN1, S02 . . . SN2 of the switch network 28 connected to the first and second circuit nodes 36, 40, respectively, at intervals along one of these physical dimensions, and the current generator 44 can draw the compensation current ICOMP from the first circuit node 36 and supply the compensation current ICOMP to the second circuit node 40 at locations on these areas of conductive material selected to optimize the effectiveness of the compensation current ICOMP in compensating for the variability of the first and second conductor node currents IDAC1, IDAC2.

Figure 2A:
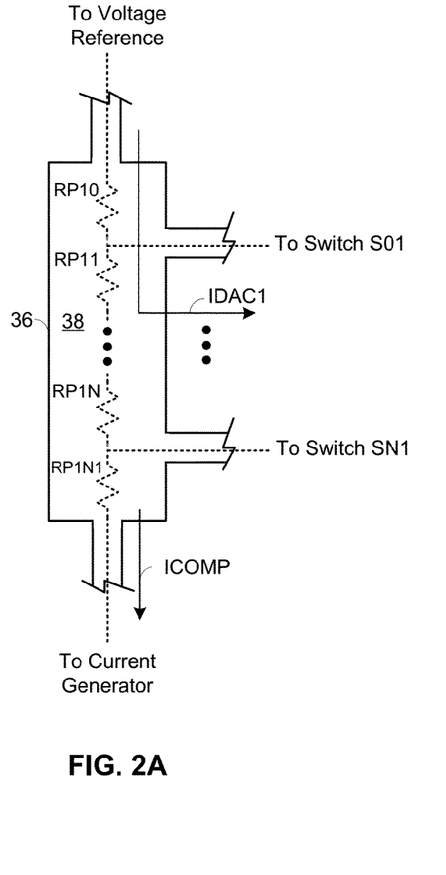
FIGS. 2A and 2B are cross-sectional views of embodiments of first and second circuit nodes, respectively, of the DAC circuit of FIG. 1.
Figure 2B:
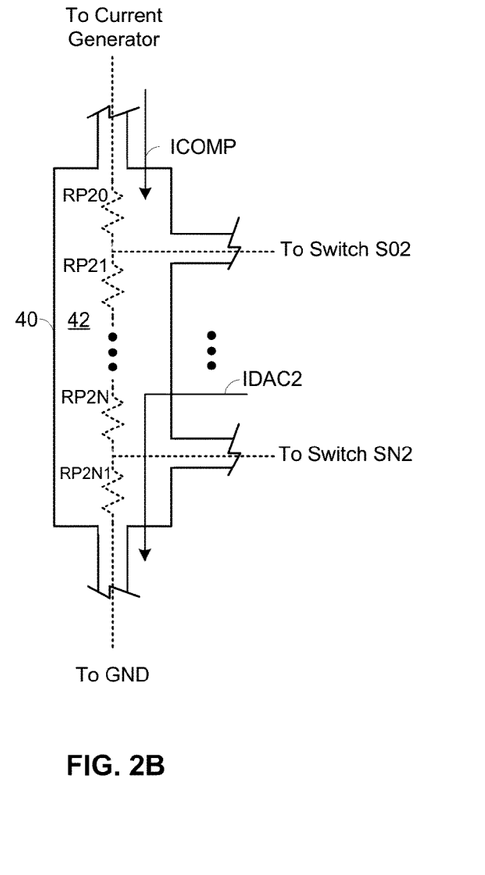

FIGS. 2A and 2B depict cross-sectional view of embodiments of physical implementation of the first and second circuit nodes 36, 40 and their connections to the voltage reference 32, current generator 44, and first and second pluralities of switches S01 . . . SN1, S02 . . . SN2 of the switch network 28. The first and second circuit nodes 36, 40 can include first and second areas 38, 42 of conductive material, such as first and second rectilinear areas of conductive material, having one or more overall physical dimensions, such as overall lengths and widths. The first plurality of switches S01 . . . SN1 of the switch network 28 can be connected at regular intervals along one of the overall physical dimensions, such as along the overall length, of the first area of conductive material 38, and the second plurality of switches S02 . . . SN2 of the switch network 28 can be connected at regular intervals along one of the overall physical dimensions, such as along the overall length, of the second area of conductive material 42.

The first and second areas of conductive material 38, 42 of the first and second circuit nodes 36, 40 can be represented electrically as a plurality of parasitic resistances RP10 . . . RP1N1, RP20 . . . RP2N1 connected in series between first and second locations of the areas of conductive material 38, 42 along one of the physical dimensions of these areas, as shown in dashed lines in FIGS. 2A and 2B. These strings of parasitic resistances RP10 . . . RP1N1, RP20 . . . RP2N1 can include parasitic resistances RP10, RP20 between the first location of the areas of conductive material 38, 42 and the first connections to switches S01, S02 of the first switch pair SP0 of the switch network 28, parasitic resistances RP11 . . . RP1N, RP21 . . . RP2N between each connection to switches of a given switch pair of the switch network 28 to switches of a next switch pair of the switch network 28, and parasitic resistances RP1N1, RP2N1 between a final connection to switches SN1, SN2 of a final switch pair SPN of the switch network 28 and the second location of the areas of conductive material 38, 42.

The current generator 44 can draw the compensation current ICOMP from the first circuit node 36 and supply the compensation current ICOMP to the second circuit node 40 at locations of the first and second areas of conductive material 38, 42 selected to optimize the effectiveness of the compensation current ICOMP in compensating for the variability of the first and second DAC currents IDAC1, IDAC2. In one embodiment, the current generator 44 can be connected to the first and second circuit nodes 36, 40 at locations of the first and second areas of conductive material 38, 42 so that the connections of the first and second pluralities of switches S01 . . . SN1, S02 . . . SN2 of the switch network 28, or alternatively a subset of these switches, to the first and second areas of conductive material 38, 42 lie between the connections of the current generator 40, voltage reference 32 and ground GND at the first and second locations of the first and second areas of conductive material 38, 42. In this way, the drawing of the compensation current ICOMP from the first circuit node 36 and the supplying of the compensation current ICOMP to the second circuit node 42 can at least partially compensate for each of the subcurrents contributing to the first and second DAC currents IDAC1, IDAC2 by each of the first and second pluralities of switches S01 . . . SN1, S02 . . . SN2 enabled for any given digital input DIN.

For example, as shown in FIG. 2A, the voltage reference 32 can be connected to the first circuit node 36 at the first location of the first area of conductive material 38, and the current generator 44 can be connected to the first circuit node 36 at the second location of the first area of conductive material 38 opposite the first location, so that the first plurality of switches S01 . . . SN1 of the switch network 28 can be connected to the first circuit node 36 at intervals along the overall length of the first area of conductive material 38 between the first and second locations. Similarly, as shown in FIG. 2B, the current generator 44 can be connected to the second circuit node 40 at the first location of the second area of conductive material 42, and ground GND can be connected to the second circuit node 40 at the second location of the second area of conductive material 42 opposite the first location, so that the second plurality of switches S02 . . . SN2 of the switch network 28 can be connected to the second circuit node 40 at intervals along the overall length of the second area of conductive material 42 between the first and second locations.

Note that other electrical connections to the areas of conductive material 38, 42 may exist in addition to those shown in FIGS. 2A and 2B. For example, in embodiments such as that of FIG. 3, discussed below, an additional electrical connection can be made by the current generator 44 to the first location of the first area of conductive material 38 to supply an additional current.

The conductive material of the areas of conductive material 38, 42 of the first and second circuit nodes 36, 40 can include, e.g., one or more of aluminum, copper, titanium, polysilicon, or other metals or conductive semiconductor materials.

In one embodiment, the current generator 44 can generate the compensation current ICOMP as a function of a voltage or current of one or more circuit components of the voltage reference 32. FIG. 3 depicts a portion of the DAC circuit showing details of an embodiment of the current generator 44A configured to generate the compensation current ICOMP as a function of a voltage or current of an output transistor P1 of the voltage reference 32. For purposes of this description, FIG. 3 depicts only the current generator 44A and portions of the DAC circuit 20 interacting with the depicted current generator 44A, such as portions of the voltage reference 32 and the first and second circuit nodes 36, 40.

The voltage reference 32 can generate and supply the reference voltage VREF and the first DAC current IDAC1 to the first circuit node 36. The voltage reference can include different subcircuits to perform various functions, but for purpose of this discussion, FIG. 3 depicts on only a portion of an output stage 48 of the voltage reference 32 providing the reference voltage VREF and first DAC current IDAC1. The output stage 48 can include the output transistor P1 connected to an output node of the voltage reference to supply the reference voltage VREF and the first DAC current IDAC1 to the first circuit node 36. The output stage can also include a current source I1 to supply a bias current to this output transistor P1.

Figure 3:
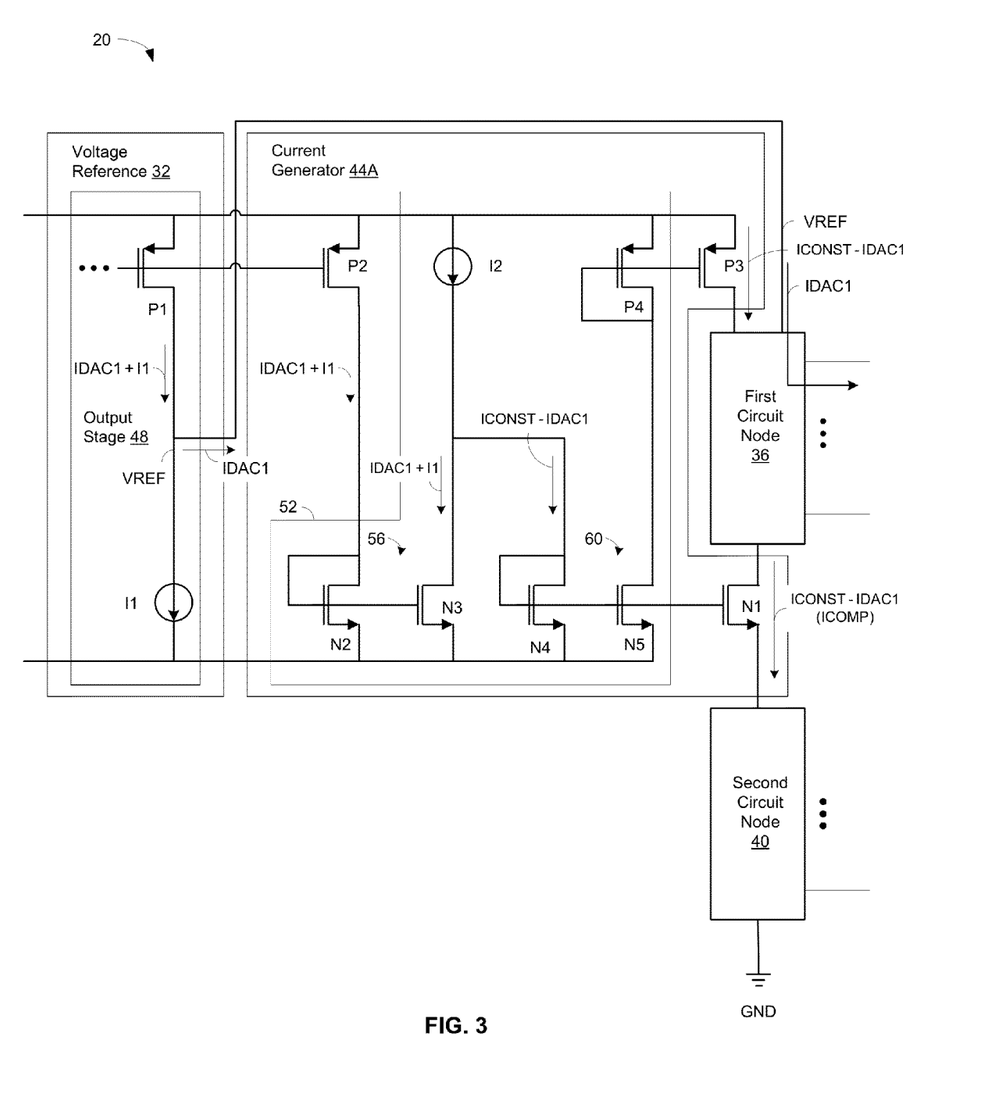
FIG. 3 is a circuit schematic depicting an embodiment of the current generator and other portions of the DAC circuit of FIG. 1.

The current generator 44A of FIG. 3 can generate the compensation current ICOMP as a function of a voltage or current of the voltage reference output transistor P1 supplying the reference voltage VREF and first DAC current IDAC1. The current generator 44A can include a transistor P2 to replicate the gate voltage of and current supplied by the voltage reference output transistor P1, a current processing circuit 52 to generate one or more copies of a current having an intended value of the compensation current ICOMP from the replicated current, a transistor P3 to supply a current having a value substantially equal to the compensation current ICOMP to the first circuit node 36 at in parallel with the first DAC current IDAC1 supplied by the voltage reference output transistor P1, and a transistor N1 to draw the compensation current ICOMP from the first circuit node 36 and supply the compensation current ICOMP to the second circuit node 40.

In more detail, the transistor P2 can include a gate connected to the gate of the voltage reference output transistor p1, a source connected to a same node as the source of the output transistor P1, and a drain connected to the current processing circuit 52. The transistor P2 can thus have a gate-to-source voltage that replicates that of the output transistor P1 and supply a current to the current processing circuit 52 that replicates a current of the output transistor P1. The output transistor current, and thus also the replica current provided by the transistor P2, can have a value substantially equal to a sum of the first DAC current IDAC1 and a current of the current source I1, or IP1=I1+IDAC1.

The current processing circuit 52 can receive the replica of the voltage reference output transistor current from the transistor P2 and generate one or more copies of a current having an intended value of the compensation current ICOMP for provision by the transistors P3 and N2 to/from the first and second circuit nodes 36, 40. The current processing circuit 52 can include a current mirror 56 to receive and mirror the replica current from the transistor P2, a current source I2 to supply a bias current to the output of the current mirror 56 and a current mirror 60, the current mirror 60 to receive a current having the intended value of the compensation current ICOMP from the current mirror 56 and the current source I2, and a current mirror transistor P4 to receive this current from the current mirror 60.

The current mirror 56 can receive the replica current from the transistor P2 and mirror this current into the node connected to the current source I2 and the current mirror 60, thereby implementing a summation of these currents at this node and producing the intended value of the compensation current ICOMP. The current mirror 56 can include a transistor N2 having a gate and a drain connected to a drain of the transistor P2 to receive the replica current from the transistor P2, and a transistor N3 having a gate connected to the gate and drain of the transistor N2 and a source connected to the same node as the source of the transistor N2, to reproduce the replica current.

The current mirror 60 can receive a current from the node connecting the current mirror 56, the current source I2 and the current mirror 60. The intersection of the currents at this connecting node can effectively subtract the value of the first DAC current IDAC1 from a constant value, thereby generating the intended value of the compensation current ICOMP. The current mirror 60 can include a transistor N4 having a gate and a drain connected to the node connecting the current mirror 56, the current source I2 and the current mirror 60, to receive a current from the connecting node, and a transistor N5 having a gate connected to the gate and drain of the transistor N4 and a source connected to the same node as the source of the transistor N4, to replicate the current received by the transistor N4.

The current received by the transistor N4 and mirrored by the transistor N5 can have a value substantially equal to a subtraction of the current in the transistor N3 from the current of the current source I2, or a current IN4 having a value according to IN4=I2−IN3=I2−(I1+IDAC). This expression can be rearranged to yield an expression for the current IN4 in terms of the first DAC current IDAC1 and the constant current ICONST, or IN4=(I2−I1)−IDAC1, or IN4=ICONST−IDAC when the first and second DAC currents IDAC1, IDAC2 can be regarded as equal. Thus, the current mirror 60 produces a current in transistor N4 having a value substantially equal to the intended value of the compensation current ICOMP as in equations (3) and/or (5), with the value of the constant current ICONST being selectable by selecting the values of the currents of the current sources I1 and I2.

The current mirror transistor P4 can form part of a current mirror including transistor P3 that can supply a current having the value of the compensation current ICOMP to the first circuit node 36 in parallel with the provision of the reference voltage VREF and first DAC current IDAC1 to this circuit node 36. The current mirror transistor P4 can include a gate and drain connected to the drain of the transistor N5 of the current mirror 60 to receive the current provided by the transistor N5 having the value of the compensation current ICOMP.

The transistor P3 can supply the current having the value of the compensation current ICOMP to the first circuit node 36 in parallel with, and optionally at a substantially similar physical location as, the provision of the reference voltage VREF and first DAC current IDAC1 to the first circuit node 36. The transistor P3 can include a gate connected to a gate and drain of the transistor P4 and a source connected to a same node as the source of the transistor P4, and can thus provide a replica of the current in the transistor P4, having the value of the compensation current ICOMP, to the first circuit node 36.

The transistor N1 can draw the compensation current ICOMP from the first circuit node 36 at the second location of this node 36 and supply the compensation current ICOMP to the second circuit node 40 at the first location of this node 40. The transistor N1 can include a gate connected to a gate of the transistor N4, and a source connected to a node having a similar voltage as the source of the transistor N4, and can thus draw the compensation current ICOMP from the first circuit node 36 and supply the compensation current ICOMP to the second circuit node as a replica of the current in the transistor N4.

Thus, in operation, the current generator 44A of FIG. 3 can generate the compensation current ICOMP by replicating the current in the voltage reference output transitor P1 that supplies the reference voltage VREF and first DAC current IDAC1 to the first circuit node 36; generating the value of the compensation current ICOMP according to equations (3) and/or (5) by reproducing the replicated current and subtracting the reproduced replicated current form a constant value to form a difference between a constant current ICONST and the first DAC current IDAC1; drawing the compensation current ICOMP from the first circuit node 36 at the second location of this node 36 and supplying the compensation current ICOMP to the second circuit node 40 at the first location of this node 40. Embodiments of the current generator 44 can include circuits other than shown in FIG. 3 but still perform these functions.

The replicating of currents through the use of gate-connected transistors and current mirrors in the current generator 44A of FIG. 3 can either identically replicate a current or replicate the current at an increased or reduced ratio by selecting a relative sizing of the gate-connected or current mirror transistors to select a ratio of the current to be replicated and the replica current.

Variations of the current generator 44A depicted in FIG. 3 can be configured to generate the compensation current ICOMP as a function of a voltage or current of one or more circuit components of the voltage reference 32 other than the output transistor P1, such as one or more of another transistor, a resistor, a capacitor, or an inductor of the voltage reference 32.

In one embodiment, the current generator 44 can generate the compensation current ICOMP as a function of the analog output voltage VOUT of the DAC circuit 20. FIG. 4 depicts a portion of the DAC circuit 20 showing details of an embodiment of the current generator 44B configured to generate the compensation current ICOMP as a function of a the analog output voltage VOUT. For purposes of this description, FIG. 4 depicts only the current generator 44B and portions of the DAC circuit 20 interacting with the depicted current generator 44B, such as the voltage reference 32, first circuit node 36 and second circuit node 40.

The current generator 44B can include a first amplifier circuit 64 to receive the analog output voltage VOUT and the reference voltage VREF and generate a control voltage VC as a function of the received analog output voltage VOUT and reference voltage VREF, and a second amplifier circuit 68 to receive the control voltage VC and generate the compensation current ICOMP as a function of the received control voltage VC.

The first amplifier circuit 64 can include a first amplifier A1, first and second switched resistor networks, and a switching signal generator, and can be arranged in a negative feedback configuration to produce a difference output as a function of the analog output voltage VOUT and reference voltage VREF.

The amplifier A1 can be an operational amplifier having positive input, negative input, and output terminals. The first switched resistor network can include a resistor R1 connected via a switch SA1 between the analog output voltage and a positive input terminal of the amplifier A1, a resistor R2 connected via a switch SA2 between the reference voltage and the positive input terminal, and a resistor R3 connected between ground GND and the positive input terminal. The second switched resistor network can include a resistor R4 connected via a switch SA3 between the analog output voltage VOUT and a negative input terminal of the amplifier A1, a resistor R5 connected via a switch SA4 between the reference voltage VREF and the negative input terminal, and a third resistor R6 connected between an output terminal and the negative input terminal of the amplifier A1.

The switching signal generator can include a comparator COMP and an inverter INV. The comparator COMP can receive the analog output voltage VOUT at a positive input terminal and a voltage having a value substantially equal to one-half of the reference voltage VREF, or VREF/2, at a negative input terminal, and produce a switching control signal VSW at an output terminal. The inverter INV can receive the switching control signal VSW at an input and produce an inverted switching control signal VSWB at an output, the inverted switching control signal VSWB being an inverse of the switching control signal VSW.

In operation, the switching signal generator can compare the analog output voltage VOUT to one-half of the reference voltage VREF, or VREF/2, and generate a logic high value of the switching control signal VSW for values of the analog output voltage VOUT greater than one half of the reference voltage VREF, or VREF/2, and a logic low value of the switching control signal VSW for values of the analog output voltage VOUT less than one half of the reference voltage VREF, or VREF/2.

For the logic high value of the switching control signal VSW, and corresponding logic low value of the inverse switching control signal VSWB, the analog output voltage VOUT can be electrically connected to the resistor R1 by switch SA1, the reference voltage VREF can be electrically disconnected from the resistor R2 by switch SA2, the analog output voltage VOUT can be electrically disconnected from the resistor R4 by switch SA3, and the reference voltage VREF can be electrically connected to the resistor R5 by switch SM. With selectively chosen resistance vales of the resistors R1-R6, the first amplifier circuit 64 can produce a first value of the control voltage VC according to the following equation:

$$VC = VOUT - \frac{1}{2}VREF. \tag{6}$$

For the logic low value of the switching control signal VSW, and corresponding logic high value of the inverse switching control signal VSWB, the analog output voltage VOUT can be electrically disconnected from the resistor R1 by switch SA1, the reference voltage VREF can be electrically connected to the resistor R2 by switch SA2, the analog output voltage VOUT can be electrically connected to the resistor R4 by switch SA3, and the reference voltage VREF can be disconnected from the resistor R5 by switch SA4. With selectively chosen resistance vales of the resistors R1-R6, the amplifier circuit 64 can produce a value of the control voltage VC according to the following equation:

$$VC = \frac{1}{2}VREF - VOUT. \tag{7}$$

For example, one set of resistance values that can produce first and second values of the control voltage VC according to equations (6) and (7) can include R1=RN, R2=3RN, R3=RN, R4=RN, R5=2RN, and R6=RN, where RN is a nominal or unit resistance value.

The second amplifier circuit 68 can include a second amplifier A2, a transistor N6 and a resistor R arranged in a negative feedback configuration to produce the compensation current ICOMP as a function of the received control voltage VC and thus also the analog output voltage VOUT and reference voltage VREF.

The amplifier A2 can be an operational amplifier having positive input, negative input, and output terminals, and can receive the control voltage VC from the first amplifier circuit 68 at the positive input terminal. The transistor N6 can include a gate connected to the output terminal of the amplifier A2, a source connected to the negative input terminal of the amplifier A2 and a first terminal of the resistor R, and a drain connected to the first circuit node 36. The resistor R can include the first terminal connected to the transistor N6 and a second terminal connected to the second circuit node 40.

In operation, the negative feedback configuration of the second amplifier circuit 68 can regulate the voltage at the negative input terminal to follow the control voltage VC received at the positive input terminal of the amplifier A2 in part by producing an output voltage at the output terminal of the amplifier A2 necessary to generate a current in the transistor N6 that matches a current produced by the control voltage VC appearing across the resistor R. The control voltage VC can thus appear at the first terminal of the resistor R, with the second terminal of the resistor R effectively connected to ground GND for purposes of the present discussion, and the voltage across the resistor R thus can effectively equal to the control voltage VC generated by and received from the first amplifier circuit 64. The current travelling through the resistor R and the transistor N6, and thus the compensation current ICOMP drawn from the first circuit node 36 and supplied to the second circuit node 40, respectively, can therefore be represented as a function of the control voltage VC as in the following equation:

$$ICOMP = \frac{VC}{R2}. \tag{8}$$

This expression of the compensation current can be rewritten using equations (6) and (7) above to yield, for values of the analog output VOUT greater than one-half of the reference voltage VREF, or VREF/2, and corresponding to the logic high value of the control signal VC, values of the compensation current ICOMP according to the following equation:

$$ICOMP = \frac{1}{R}\left(VOUT - \frac{1}{2}VREF\right); \tag{9}$$

and for values of the analog output VOUT less than one-half of the reference voltage VREF, or VREF/2, and corresponding to the logic low value of the control signal VC, values of the compensation current ICOMP according to the following equation:

$$ICOMP = \frac{1}{R}\left(\frac{1}{2}VREF - VOUT\right). \tag{10}$$

Figure 4:
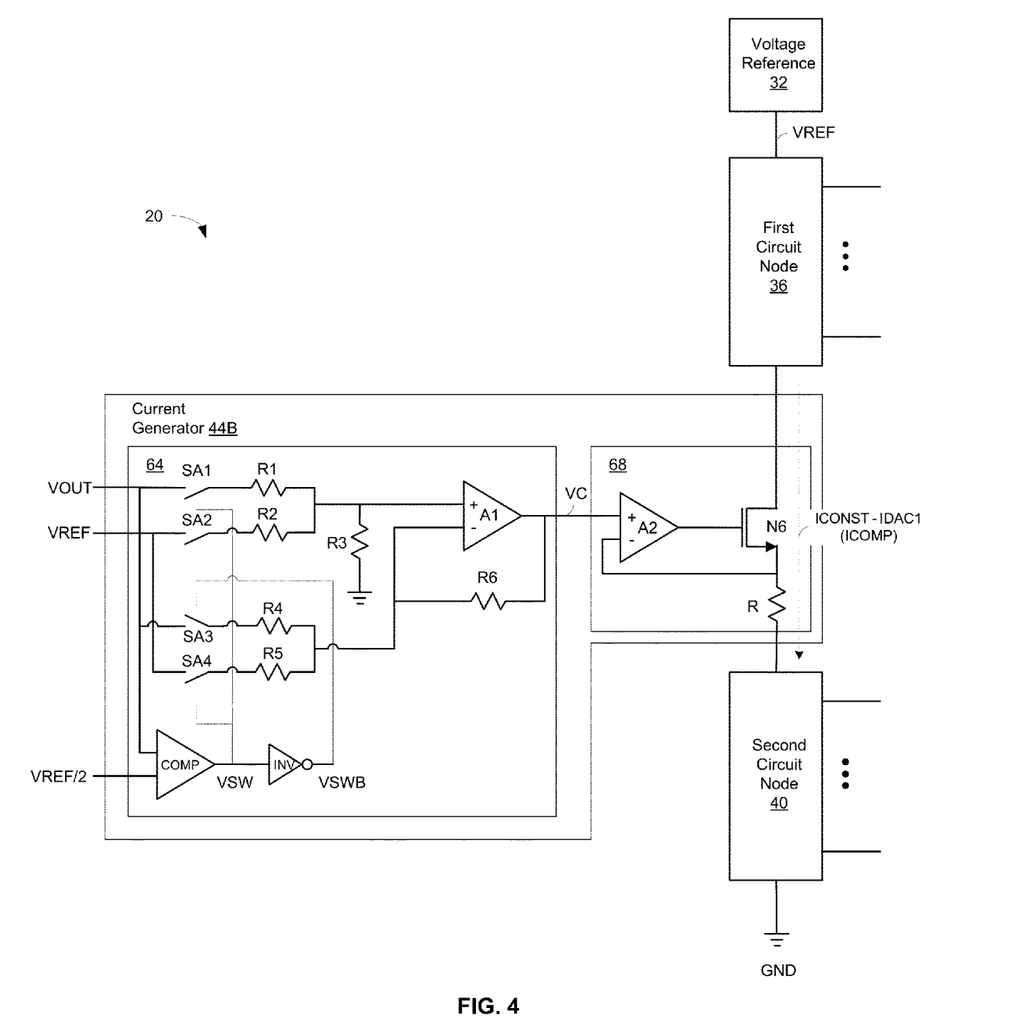
FIG. 4 is a circuit schematic depicting another embodiment of the current generator and other portions of the DAC circuit of FIG. 1.
Figure 5:
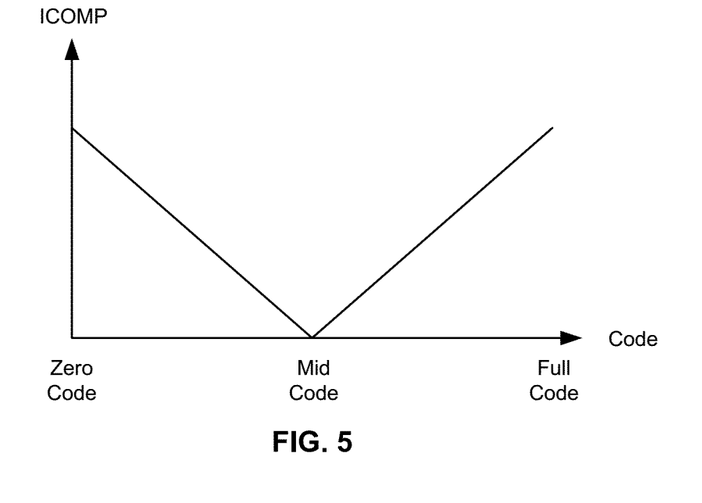
FIG. 5 is a graph depicting an embodiment of the compensation current generated by the current generator of FIG. 4 as a function of a digital input to the DAC circuit.

FIG. 5 depicts an embodiment of a representation of the compensation current ICOMP generated by the current generator 44B of FIG. 4 as a function of the digital input DIN (i.e., code) received by the DAC circuit 20. At a zero code digital input DIN, corresponding to a zero value analog output voltage VOUT, the compensation current ICOMP can achieve a maximum value. At a mid code digital input DIN, corresponding to value of the analog output voltage VOUT at one half the reference voltage VREF, or VREF/2, the compensation current ICOMP can achieve a minimum value of zero. At a full code digital input DIN, corresponding to a maximum value of the analog output voltage VOUT substantially equal to the reference voltage VREF, the compensation current ICOMP can again achieve a maximum value. The compensation current ICOMP so generated can vary linearly between the maximum, minimum and maximum values generated for these zero, mid and full code digital inputs DIN. The resistance value R can also be selected to set the specific values of these maximum and minimum compensation current values.

The compensation current ICOMP generated by the current generator 44B can substantially satisfy or approximate the values of the compensation current expressed by equation (5).

Figure 6:
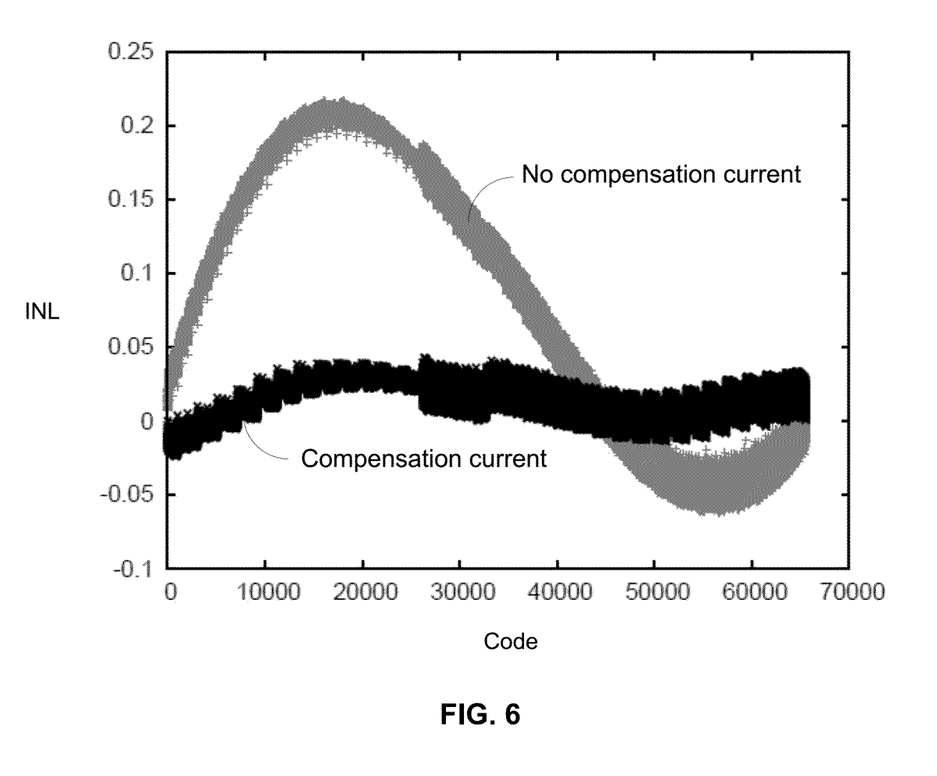
FIG. 6 is a graph depicting integral nonlinearity of the DAC circuit of FIG. 3 and of a DAC circuit not being provided with a compensation current.

FIG. 6 is a graph depicting a representation of an integral nonlinearity (INL) of the DAC circuit 20 of FIG. 3 in comparison to a similar DAC circuit without a current generator providing a compensation current. As shown in FIG. 6, the provision of the compensation current ICOMP by the current generator 44 can improve the INL of the DAC circuit 20 by approximately four times that of a similar DAC circuit without a current generator providing a compensation current.

Various different embodiments of amplifiers, comparators and inverters can be used as the amplifiers, comparators and inverters discussed herein. The switches of the switch network can each be implemented by one or more transistors. Various other embodiments of switches can also be used to implement the switches of the switch network. The resistor network can also include various different configurations of resistor branches, such as various configurations of parallel and series resistors.

Additional embodiments of the DAC circuit 20 and current generator 44 are possible. For example, any feature of any of the embodiments of the DAC circuit 20 or current generator 44 described herein can optionally be used in any other embodiment of the DAC circuit 20 or current generator 44. Also, embodiments of the DAC circuit 20 and current generator 44 can optionally include any subset of the components or features of the DAC circuit 20 and current generator 44 described herein.

What is claimed is:

1. A digital-to-analog converter (DAC) circuit, comprising:
a resistor network connected to an output node;
a switch network having a first plurality of switches connecting the resistor network to a first circuit node and a second plurality of switches connecting the resistor network to a second circuit node;
a voltage reference to supply a reference voltage to the first circuit node; and
a current generator connected to the first circuit node and the second circuit node, to generate a compensation current, draw the compensation current from the first circuit node, and supply the compensation current to the second circuit node.

2. The DAC circuit of claim 1, wherein the current generator generates the compensation current as a function of the at least one of a current or a voltage of a component of the voltage reference.

3. The DAC circuit of claim 1, wherein the current generator generates the compensation current as a function of an analog output voltage produced at the output node and corresponding to a conversion of a digital input received by the DAC circuit to the analog domain.

4. The DAC circuit of claim 1, wherein the switch network draws a first DAC current from the first circuit node into the resistor network, and the current generator generates the compensation current to have a value substantially equal to a subtraction of the first DAC current from a constant value.

5. The DAC circuit of claim 1, wherein the first circuit node includes a first area of conductive material, the voltage reference supplies the reference voltage to the first area of conductive material at a first location, the current generator draws the compensation current from the first area of conductive material at a second location, and the first plurality of switches connect to the first area of conductive material at locations between the first and second locations.

6. The DAC circuit of claim 1, wherein the second circuit node includes a second area of conductive material, the current generator draws the compensation current from the second area of conductive material at a first location, a ground is supplied to the second area of conductive material at a second location, and the second plurality of switches connect to the second area of conductive material at locations between the first and second locations.

7. The DAC circuit of claim 2, wherein the voltage reference includes an output transistor to supply the reference voltage to the first circuit node, and the current generator generates the compensation current as a function of at least one current or voltage of the output transistor of the voltage reference.

8. The DAC circuit of claim 7, wherein the current generator includes at least one transistor connected to and replicating a current in the output transistor of the voltage reference.

9. The DAC circuit of claim 8, wherein the current generator includes a current processing circuit to subtract a current having a value substantially equal to the replicated current of the output transistor from a constant current to generate a value of the compensation current.

10. The DAC circuit of claim 7, wherein the current generator includes a transistor to draw the compensation current from the first circuit node and supply the compensation current to the second circuit node.

11. The DAC circuit of claim 7, wherein the current generator includes a transistor to supply a current having a value substantially equal to that of the compensation current to the first circuit node.

12. The DAC circuit of claim 1, wherein the current generator generates the compensation current as a function of the at least one of a current or a voltage of at least one of a resistor, capacitor or inductor of the voltage reference.

13. The DAC circuit of claim 3, wherein the current generator includes a plurality of amplifier circuits to generate the compensation current as the function of the analog output voltage.

14. The DAC circuit of claim 13, wherein the plurality of amplifier circuits includes:
a first amplifier circuit including a first amplifier, a plurality of resistors, and a plurality of switches arranged in a negative feedback configuration to generate a control voltage as a difference function based on the analog output voltage and the reference voltage; and
a second amplifier circuit, connected to the first amplifier circuit, including a second amplifier, a transistor, and a second resistor arranged in a negative feedback configuration to regulate a voltage across the resistor and a gate-to-source voltage of the transistor as functions of the control voltage generated by the first amplifier circuit,
wherein the transistor and resistor of the second amplifier circuit are connected together, the transistor draws the compensation current from the first circuit node, and the resistor supplies the compensation current to the second circuit node.

15. A method of operating a digital-to-analog converter (DAC) circuit, the DAC circuit including a resistor network connected to an output node, a switch network having a first plurality of switches connecting the resistor network to a first circuit node and a second plurality of switches connecting the resistor network to a second circuit node, and a voltage reference to supply a reference voltage to the first circuit node, the method comprising:
generating by a current generator connected to the first circuit node and the second circuit node a compensation current;
drawing by the current generator the compensation current from the first circuit node, and
supplying by the current generator the compensation current to the second circuit node.

16. The method of claim 15, wherein the current generator generates the compensation current as a function of the at least one of a current or a voltage of a component of the voltage reference.

17. The method of claim 15, wherein the current generator generates the compensation current as a function of an analog output voltage produced at the output node and corresponding to a conversion of a digital input received by the DAC circuit to the analog domain.

18. The method of claim 15, wherein the switch network draws a first DAC current from the first circuit node into the resistor network, and the current generator generates the compensation current to have a value substantially equal to a subtraction of the first DAC current from a constant value.

19. The method of claim 15, wherein the first circuit node includes a first area of conductive material, the voltage reference supplies the reference voltage to the first area of conductive material at a first location, the current generator draws the compensation current from the first area of conductive material at a second location, and the first plurality of switches connect to the first area of conductive material at locations between the first and second locations.

20. The method of claim 15, wherein the second circuit node includes a second area of conductive material, the current generator draws the compensation current from the second area of conductive material at a first location, a ground is supplied to the second area of conductive material at a second location, and the second plurality of switches connect to the second area of conductive material at locations between the first and second locations.

21. The method of claim 16, wherein the voltage reference includes an output transistor to supply the reference voltage to the first circuit node, and the current generator generates the compensation current as a function of at least one current or voltage of the output transistor of the voltage reference.

22. The method of claim 21, wherein the current generator includes at least one transistor connected to and replicating a current in the output transistor of the voltage reference.

23. The method of claim 22, wherein the current generator includes a current processing circuit to subtract a current having a value substantially equal to the replicated current of the output transistor from a constant current to generate a value of the compensation current.

24. The method of claim 16, wherein the current generator includes a transistor to draw the compensation current from the first circuit node and supply the compensation current to the second circuit node.

25. The method of claim 16, wherein the current generator includes a transistor to supply a current having a value substantially equal to that of the compensation current to the first circuit node.

26. The method of claim 15, wherein the current generator generates the compensation current as a function of the at least one of a current or a voltage of at least one of a resistor, capacitor or inductor of the voltage reference.

\* \* \* \* \*